United States Patent
Boitnott

[11] Patent Number: 5,814,154
[45] Date of Patent: Sep. 29, 1998

[54] SHORT-COUPLED-PATH EXTENDER FOR PLASMA SOURCE

[75] Inventor: Charles A. Boitnott, Half Moon Bay, Calif.

[73] Assignee: GaSonics International, San Jose, Calif.

[21] Appl. No.: 788,602

[22] Filed: Jan. 23, 1997

[51] Int. Cl.⁶ ..................................................... C23C 16/00
[52] U.S. Cl. ...................... 118/723 R; 156/345; 118/719; 204/298.26
[58] Field of Search ................................. 118/719, 723 R, 118/723 MW, 723 MR, 723 MP, 723 ME, 723 E, 723 ER, 50.1; 204/298.25, 298.26, 298.35; 156/345 P, 345 PC, 345 WH, 345 MC

[56] References Cited

U.S. PATENT DOCUMENTS

| 4,960,071 | 10/1990 | Akahori et al. | 118/722 |
|---|---|---|---|
| 5,125,358 | 6/1992 | Ueda et al. | 118/723 |
| 5,284,544 | 2/1994 | Mizutani et al. | 156/345 |
| 5,433,787 | 7/1995 | Suzuki et al. | 118/723 MP |
| 5,529,632 | 6/1996 | Katayama et al. | 118/723 MP |

Primary Examiner—R. Bruce Breneman
Assistant Examiner—Luz Alejandro
Attorney, Agent, or Firm—Thomas E. Schatzel; Law Offices of Thomas E. Schatzel

[57] ABSTRACT

A short-coupled-path extender comprises a two-inch thick housing that inserts as a spacer between a plasma source and a vacuum chamber in various kinds of semiconductor processing equipment. The spacer housing is generally constructed of aluminum and is thermally well-connected to the vacuum chamber and its liquid cooling system to dispose of the heat it collects from the plasma source flow. The plasma source bolts up to a central inlet port on the spacer housing that leads to a first quartz-lined antechamber within. The plasma source flow encounters a traverse metal wall at the back of the first antechamber and is forced to flow radially outward to a system of small outer ports that connect to a second quartz-lined antechamber. The plasma source flow then collects back together and exits the second antechamber through a central outlet port that bolts up to the plasma source seat on the vacuum chamber.

8 Claims, 2 Drawing Sheets

SHORT-COUPLED-PATH EXTENDER FOR PLASMA SOURCE

BACKGROUND OF THE INVENTION

1. Field of the Invention

The invention relates generally to semiconductor processing equipment and more particularly to devices and methods for isolating semiconductor wafer processes from the deleterious effects from heat and charged species flowing from plasma sources and unintended ultra-violet (UV) exposure.

2. Description of the Prior Art

Downstream plasma sources are used to generate atoms of material that are needed in semiconductor processes. The plasma sources are generally powered by radio frequency or microwave energy and attach on the top of a semiconductor wafer processing vacuum chamber.

The high temperatures produced within the plasma provides a source of convective heat transfer to the processing wafer. Subsequent heating of the wafer can produce wafer temperatures high enough to produce thermal damage to critical structures on the wafer, reducing device yield or requiring extensive further processing to remove the damage. Prior art equipment attempts to solve this problem by increasing the distance from the plasma source to the wafer using paths extended beyond ten inches.

The hot core streaming from such plasma sources toward the wafer process is conductive due to a cloud of electrons and ions that form in the plasma. Such a conductive core can activate a mobile charge ($Q_m$) on the delicate wafer and destroy some or all of its structures before the device fabrication can be completed. Long paths are sometimes used to minimize this effect.

The plasma sources can also generate ultraviolet (UV) light that can be strong enough to upset the processes under way and the structures being fabricated.

SUMMARY OF THE PRESENT INVENTION

It is therefore an object of the present invention to provide a short-coupled-path extender for plasma sources that reduces the amount of heat that is coupled from the plasma source to a wafer in a vacuum chamber.

It is another object of the present invention to provide a short-coupled-path extender for plasma sources that acts as a barrier to electrons and ions that would otherwise activate mobile charges on the wafer.

It is a further object of the present invention to provide a short-coupled-path extender for plasma sources that acts as a barrier to ultraviolet light that would otherwise radiate from the plasma source to a wafer in a vacuum chamber.

It is another object of the present invention to provide a short-coupled-path extender for plasma sources that simultaneously reduces the amount of heat that is coupled from the plasma source to a wafer in a vacuum chamber, acts as a barrier to electrons and ions that would otherwise activate mobile charges on the wafer, and prevents ultraviolet light radiating from the plasma source from reaching the wafer.

Briefly, a short-coupled-path extender embodiment of the present invention comprises a housing that inserts as a spacer between a plasma source and a vacuum chamber in various kinds of semiconductor processing equipment. The spacer housing is typically constructed of aluminum and is thermally well-connected to the vacuum chamber and its liquid cooling system to dispose of the heat it collects from the plasma source flow. The plasma source bolts up to a central inlet port on the spacer housing that leads to a first quartz-lined antechamber within. The plasma source flow encounters a traverse metal wall at the back of the first antechamber and is forced to flow radially outward to a system of small outer ports that connect to a second quartz-lined antechamber. A lesser preferred embodiment uses only one chamber. The plasma source flow then collects back together and exits the second antechamber through a central outlet port that bolts up to the plasma source seat on the vacuum chamber.

An advantage of the present invention is that a short-coupled-path extender is provided that solves the thermal drift problem caused by heating the mobile charge problem caused by conductive flows, and the exposure of the wafer to ultraviolet light.

Another advantage of the present invention is that a short-coupled-path extender is provided that allows plasma sources to be operated at two to three times or more their usual powers without increasing the above effects to the wafers.

A further advantage of the present invention is that a short-coupled-path extender is provided that substantially increases the maximum process rate when the plasma sources are operated at higher than their usual powers.

Another advantage of the present invention is that a short-coupled-path extender is provided that mechanically receives a standardized plasma source and that can bolt up to the plasma source sites provided on vacuum chambers.

These and other object and advantages of the present invention will no doubt become obvious to those of ordinary skill in the art after having read the following detailed description of the preferred embodiment which is illustrated in the drawing figures.

IN THE DRAWINGS

DETAILED DESCRIPTION OF THE PREFERRED EMBODIMENTS

Figure 1:
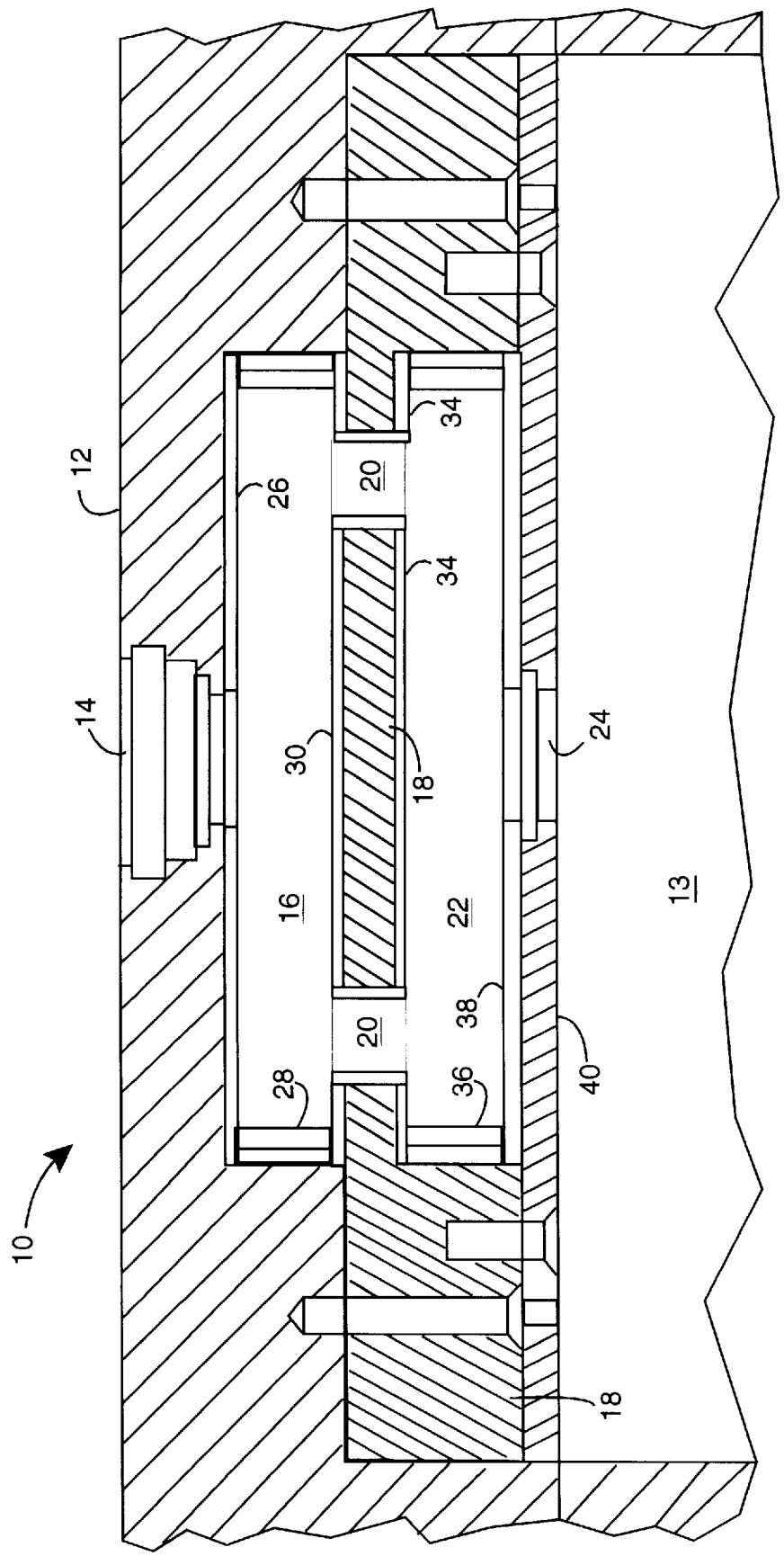
FIG. 1 is a cross sectional diagram of the short-coupled-path extender embodiment of the present invention in situ within its spacer housing.

FIG. 1 illustrates a short-coupled-path extender embodiment of the present invention, referred to herein by the general reference numeral 10. A metal spacer housing 12 is shown only in FIG. 1, and is preferably constructed of aluminum and bolted between a plasma source and a semiconductor wafer processing vacuum chamber 13. A good thermal connection is preferably provided between the spacer housing 12 and a liquid cooling system in the vacuum chamber 13, e.g., to dispose of any heat collected from the plasma source flow. The plasma source bolts up to a central inlet port 14 that leads within to a first quartz-lined antechamber 16. The plasma source flow encounters a traverse metal wall 18, at the back of the first antechamber 16, and is forced to flow radially outward to a system of small outer ports 20 that connect to a second quartz-lined antechamber 22. The plasma source flow then collects back together and exits the second antechamber through a central outlet port 24 that bolts up to a plasma source seat and plenum in the vacuum chamber 13.

Figure 2:
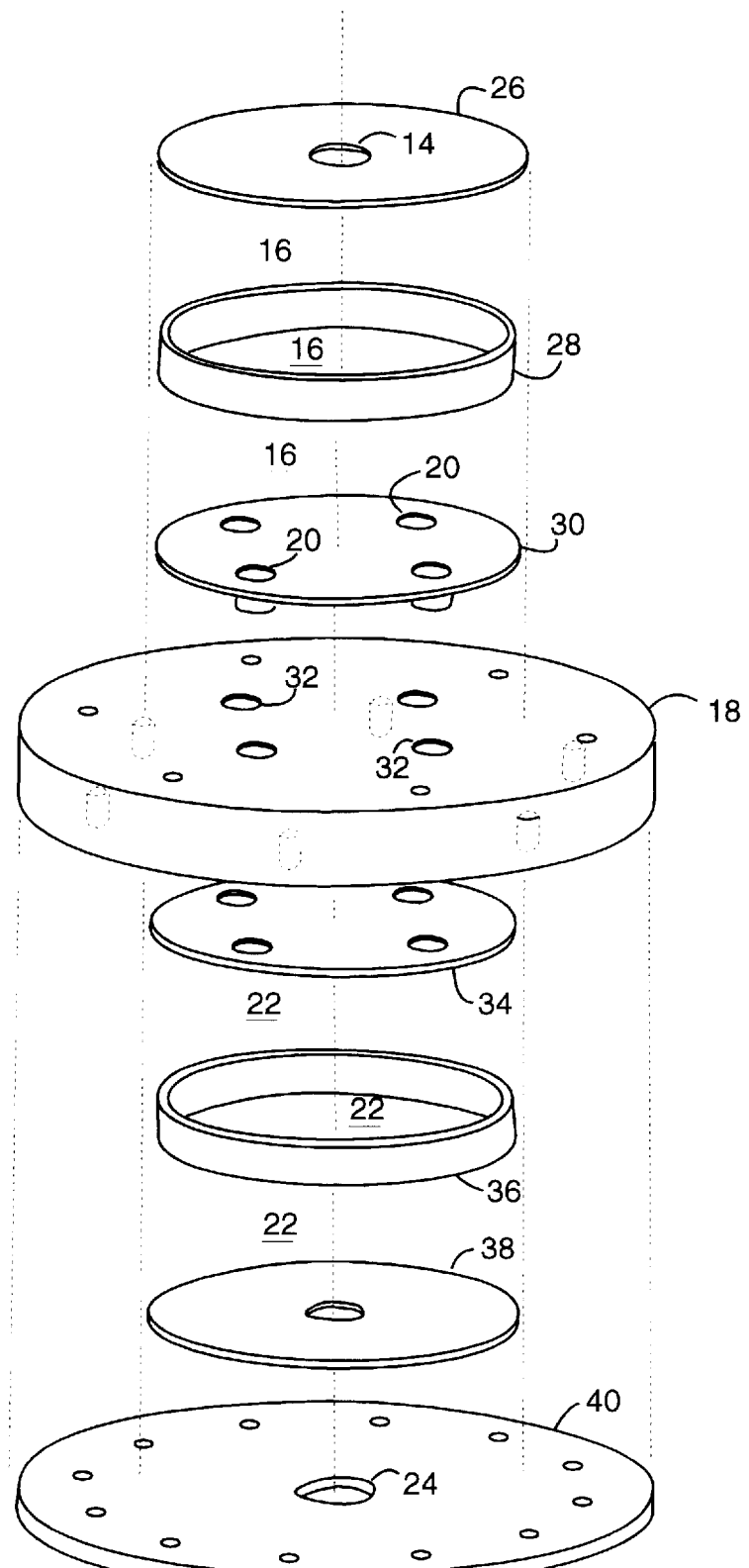
FIG. 2 is an exploded assembly view of a short-coupled-path extender of FIG. 1 shown without its spacer housing.

FIG. 2 shows another perspective of the aluminum and quartz pieces that have been assembled into the unit described in connection with FIG. 1. The spacer housing into which all the other illustrated pieces are assembled is not shown, however it can generally resemble a lid about two inches thick. No doubt others could achieve the same ends using differently formed and appropriately assembled pieces. The critical elements of the present invention include the first and second antechambers 16 and 22 that are separated by the metal wall 18 that pipes out heat, that shorts out any mobile charge, and that blinds ultraviolet radiation from a process wafer. Such effects also promote ion recombination.

A quartz liner can be used to reduce recombination when oxygen is used. But such a liner may not be needed when other process gases are used, or if expensive and more robust materials instead of aluminum are used in the construction of the housing. A quartz top plate 26 is used to line the roof of the first antechamber 16 and has a central hole for the inlet port 14. A quartz cylinder sleeve 28 is used to line the walls of the first antechamber 16. A quartz bottom plate 30 is used to line the floor of the first antechamber 16 and has a plurality of holes for the system of small outer ports 20. The wall 18 is made of aluminum and is shaped as a shallow inverted dish to improve heat transfer to the spacer housing 12. A set of matching holes 32 in the wall 18 accommodate the system of small outer ports 20. A quartz top plate 34 is used to line the roof of the second antechamber 22 and has a plurality of holes for the system of small outer ports 20. A quartz cylinder sleeve 36 is used to line the walls of the second antechamber 22. A quartz bottom plate 38 is used to line the floor of the second antechamber 22 and has a central hole for the outlet port 24 in a retaining plate 40.

Although the present invention has been described in terms of the presently preferred embodiment, it is to be understood that the disclosure is not to be interpreted as limiting. Various alterations and modifications will no doubt become apparent to those skilled in the art after having read the above disclosure. Accordingly, it is intended that the appended claims be interpreted as covering all alterations and modifications as fall within the true spirit and scope of the invention.

What is claimed is:

1. A short-coupled-path extender for insertion between a plasma source and a semiconductor wafer vacuum chamber, comprising:

a first antechamber for receiving a plasma source flow from a plasma source;

a transverse metal wall providing for blinding of ultraviolet radiation from reaching a process wafer and a separation between the first antechamber and a wafer processing chamber, and further includes a system of perforations that allows said plasma source flow to pass from the first antechamber to said wafer processing chamber;

wherein, an entering plasma source flow is made to encounter a traverse metal wall, at a back of the first antechamber and is forced to flow radially outward to a system of small outer ports.

2. The extender of claim 1, further comprising:

a second antechamber disposed in series between the first antechamber and said wafer processing chamber, and providing for an exhausting of said plasma source flow into a plenum of said semiconductor wafer processing vacuum chamber;

wherein, said transverse metal wall provides for a separation between the first and second antechambers and said system of perforations thus allows said plasma source flow to pass from the first antechamber to the second antechamber.

3. A short-coupled-path extender for insertion between a plasma source and a semiconductor wafer vacuum chamber, comprising:

a first antechamber for receiving a plasma source flow from a plasma source;

a second antechamber for exhausting said plasma source flow into a plenum of a semiconductor wafer processing vacuum chamber; and a transverse metal wall providing for blinding of ultraviolet radiation from reaching a process wafer and a separation between the first antechamber and a wafer processing chamber, and further includes a system of perforations that allows said plasma source flow to pass from the first antechamber to said wafer processing chamber;

wherein, an entering plasma source flow is made to encounter a traverse metal wall, at a back of the first antechamber and is forced to flow radially outward to a system of small outer ports.

4. The extender of claim 3, wherein:

the transverse metal wall provides for a thermal separation of the first antechamber and the second antechamber and removes heat from said plasma source flow by conducting the heat away.

5. The extender of claim 3, wherein:

the transverse metal wall provides for an electrical separation of the first antechamber and the second antechamber and promotes ion recombination.

6. The extender of claim 3, wherein:

the transverse metal wall provides for a barrier to mobile charges that would otherwise pass from the first antechamber to the second antechamber and adversely affect a processing of any wafers in said vacuum chamber.

7. The extender of claim 3, wherein:

the transverse metal wall further provides for a blinding of the first antechamber from the second antechamber so that ultraviolet light will not be radiated through to said vacuum chamber.

8. The extender of claim 3, further comprising:

a quartz liner disposed in at least one of the first and second antechambers to reduce recombination when oxygen is used.

* * * * *